United States Patent [19]

Eder

[11] Patent Number: 4,470,017

[45] Date of Patent: Sep. 4, 1984

[54] LINEAR VOLTAGE-PULSE BASE-CLIPPING CIRCUIT WITH ADJUSTABLE-THRESHOLD CONDITION AND ECHOGRAPH COMPRISING SUCH A DEVICE

[75] Inventor: André Eder, Paris, France

[73] Assignee: CGR Ultrasonic, Villenoy-les-Meaux, France

[21] Appl. No.: 246,443

[22] Filed: Mar. 23, 1981

[30] Foreign Application Priority Data

Mar. 28, 1980 [FR] France ............................... 80 07018

[51] Int. Cl.³ ............................................. H03K 5/08
[52] U.S. Cl. .................................. 328/116; 307/358; 307/555; 307/542; 328/163; 328/165; 328/169
[58] Field of Search ............... 307/351, 358, 540, 542, 307/555, 567, 568, 352, 362, 573; 328/116, 117, 163, 165, 169, 171

[56] References Cited

U.S. PATENT DOCUMENTS

| 3,548,206 | 12/1970 | Ogle et al. | 307/542 |
| 3,602,825 | 8/1971 | Senor | 307/352 |
| 3,737,790 | 6/1973 | Brown | 328/165 |
| 4,237,424 | 12/1980 | Weiner | 328/165 |

*Primary Examiner*—John Zazworsky
*Attorney, Agent, or Firm*—Roland Plottel

[57] ABSTRACT

The present invention relates to a linear voltage-pulse base-clipping circuit with adjustable-threshold condition.

It comprises, for unipolar signals, two lines in parallel. The first line transmits the signal suitably delayed by means of an adjustable delay line to an attenuator which is controlled by the second control line which provides, depending on the threshold condition, the adjustment of the transfer of the attenuator.

8 Claims, 7 Drawing Figures

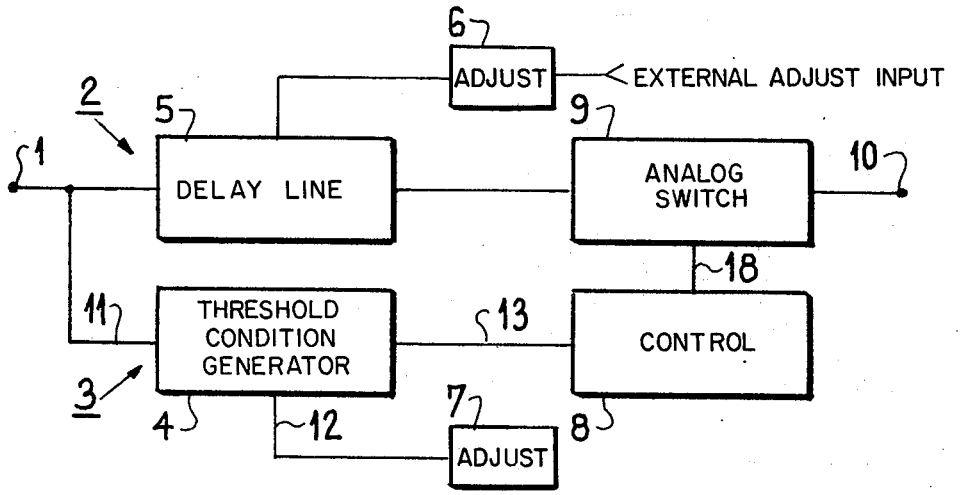
FIG_1
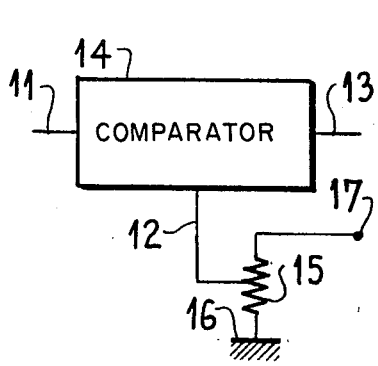
FIG_2
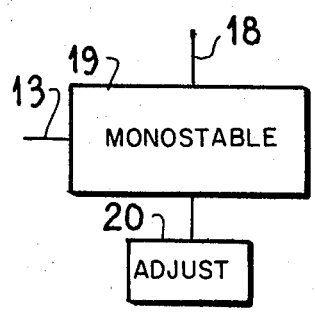
FIG_3
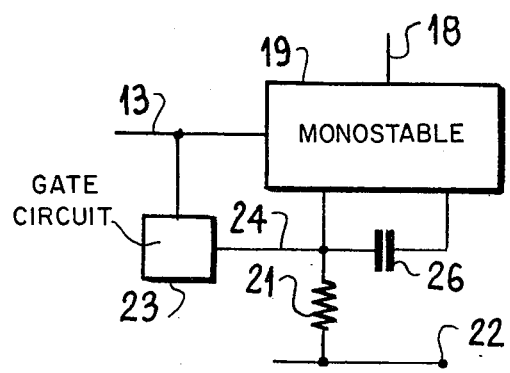
FIG_4
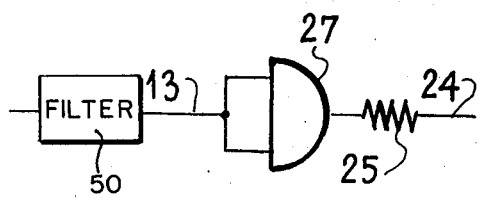
FIG_5

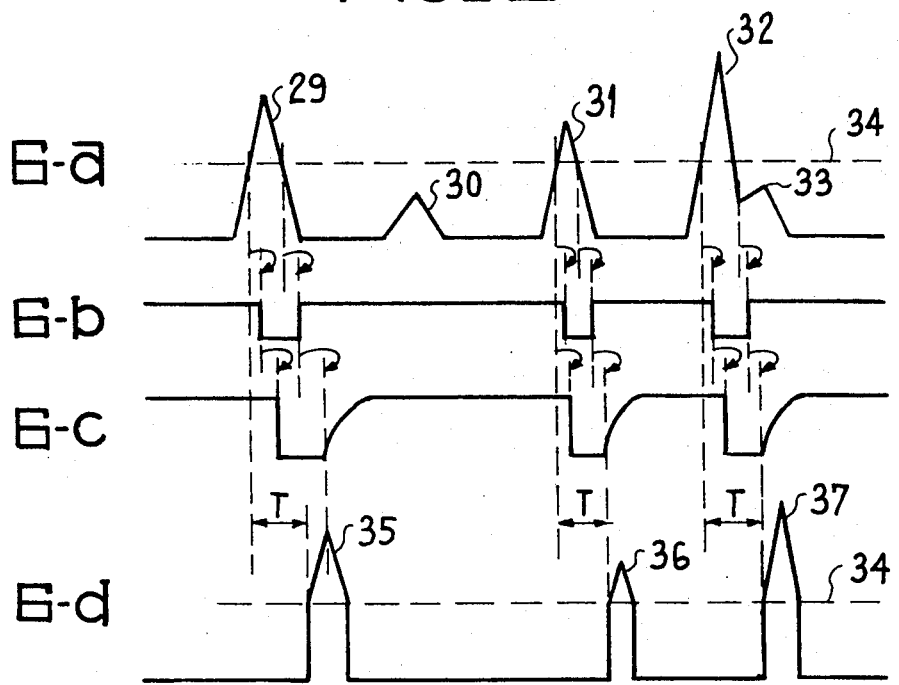
FIG_6
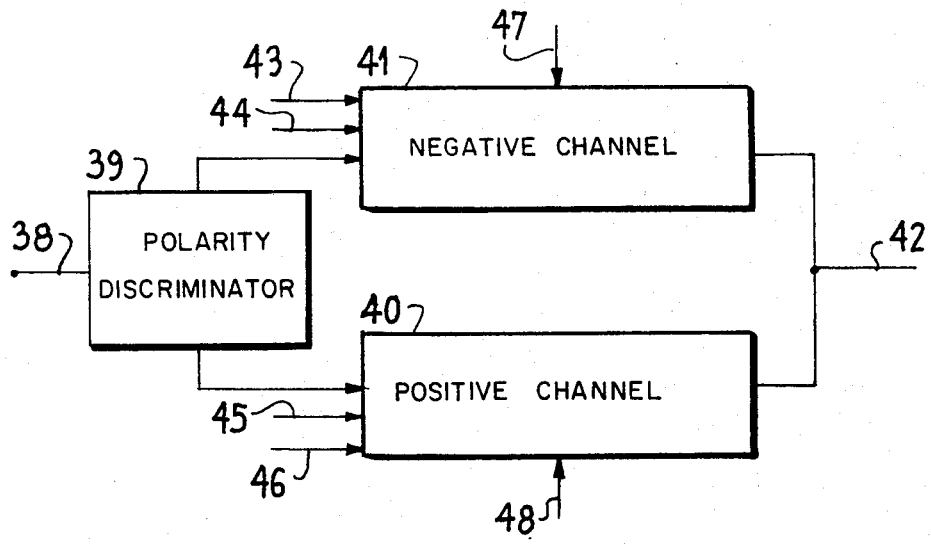
FIG_7

LINEAR VOLTAGE-PULSE BASE-CLIPPING CIRCUIT WITH ADJUSTABLE-THRESHOLD CONDITION AND ECHOGRAPH COMPRISING SUCH A DEVICE

BACKGROUND OF THE INVENTION

The present invention relates to a linear voltage pulse base-clipping circuit with adjustable threshold condition. It finds an application in any signal processing requiring the removal of parasite pulses. The invention is therefore particularly advantageous in units using pulse signals coming from a physical system for acquisition of analog data such as echographs, sonars, radars, etc.

Such circuits are known from the prior art. They are generally formed from semiconductors whose biasing is adjusted so that their output only transmits the input value from a certain threshold level, called rejection level. A major drawback of these components is their nonlinearity. A consequence of this drawback is that the amplitude relationships between pulses which the circuit selects are not retained.

SUMMARY OF THE INVENTION

To remedy this drawback in accordance with the present invention a linear voltage pulse base-clipping circuit with adjustable threshold condition comprises two lines connected in parallel. The first line, or transfer line for the analog signal, comprises in series an adjustable delay line and a controllable transfer attenuator. The second line, or control line, comprises an adjustable-threshold condition generator and a generator for controlling the attenuator.

DESCRIPTION OF THE DRAWINGS

The present invention will be better understood from the following description and accompanying drawings in which:

FIG. 1 is a block circuit diagram in accordance with the invention;
FIG. 2 is a variation of a detail of FIG. 1;
FIG. 3 is a variation of a detail of FIG. 1;
FIG. 4 is a diagram of the generator for controlling the attenuator;
FIG. 5 is a detail of FIG. 4;
FIG. 6 is a diagram of four characteristic voltages; and
FIG. 7 is a dual-channel circuit diagram.

DESCRIPTION OF THE PREFERRED EMBODIMENTS

In the first part of what follows, the description is limited to positive pulse signals. It will be understood that the same elements are applicable for negative pulse signals. The second part comprises a description of a circuit in accordance with the invention for bipolar signals. Finally, a description will be found of different applications comprising indications according to the frequency bands envisaged.

FIG. 1 is a block diagram of a circuit in accordance with the invention. This circuit comprises an input 1 and an output 10, the two parallel lines are: line 2 for transferring the analog signal and control line 3. Line 2 for transferring the analog signal comprises in series delay line 5 and the delay-adjusting circuit 6 thereof, in series with the attenuator 9. Control line 3 comprises the threshold-condition generator 4 with the adjusting circuit 7 thereof in series with the generator 8 for controlling the attenuator.

FIG. 2 shows a threshold-condition generator 4 with its threshold circuit 7. They are formed by a comparator circuit 14 comprising an input line for the voltage to be compared 11, an input line 12 for the comparison threshold voltage and an output line 13. This latter is energized when the voltage to be compared is higher than or equal to the comparison threshold voltage supplied by potentiometer 15 placed between ground 16 and the DC power supply 17.

FIG. 3 shows a particular circuit for generator 8 controlling attenuator 9. It comprises a monostable 19 and a circuit 20 for controlling and adjusting the time delay thereof.

FIG. 4 shows a particular embodiment of the circuit 20 for controlling and adjusting the time delay of monostable 19. Such a circuit 20 comprises the adjustable capacitor 26, external to the monostable, resistor 21 for adjusting the time constant of the monostable and a circuit 23 for shaping the enabling order for the time delay.

FIG. 5 shows a particular example of such a circuit 23. It comprises an AND gate 27 of the so-called open-collector type which in the high logic stage feeds through resistor 25 in line 24.

An echograph comprising such a circuit is conventionally formed from a probe operating for transmission-reception, control electronics for providing for example dynamic focusing and a processing unit for obtaining an ultrasonic image. The circuit of the invention is inserted in the chain, between the probe and the unit for processing the electro-acoustic signals for display. FIG. 6, which comprises diagrams 6-a to 6-d, enables the operation of the chain to be materialized.

After electric reshaping, the ultrasonic echoes, through the probe, give voltage pulses drowned in a noise having different origins. Among the voltage pulses collected, shown schematically in FIG. 6, in diagram 6-a, are to be found parasite echoes 30, 33. They may have different origins. They may come from reflections from the jointing between particles in metallurgy, from the inhomogeneities of tissues in medical examination, etc. Their amplitude is often reduced, relative to the pulses themselves, specific of structures to be displayed. But it is also greater than the noise level and becomes detectable by the display means.

Their position in time may assume two principal states, shown in diagram 6-a. The pulse itself 29 may be followed by a parasite pulse 30. But a pulse itself such as 32 may also contain in its trailing edge a parasite echo 33.

When such a signal is presented at the input 1 of the circuit of the invention, it is transmitted over signal-transfer line 2 to the input of attenuator 9 with a time delay generated by the delay line. This delay allows the rise time of the elements of control line 3 to be offset.

In the preferred embodiment, attenuator 9 is advantageously formed by an analog switch for example of the MOS-FET type. Its input is connected to the output of delay line 5 and its output to the output 10 of the circuit of the invention. Its control gate is connected to control line 3.

This latter also receives the signal such as 6-a. The control-signal generator 4, connected as a comparator 14, receives at its "reference voltage" input 12 a reference threshold voltage from potentiometer 17. This voltage is a DC voltage 34 in diagram 6-a. This voltage is the rejection level of the voltages at the base, that is to say that it locates the base-clipping level of the pulses. Through its "input voltage" input 11, comparator 14 receives the signal itself. The output condition is that the output line 13 of comparator 14 becomes active when the input voltage is greater than the threshold voltage 34. For a signal and a threshold voltage 34 such as in the case of diagram 6-a, the output condition of the comparator has the form of diagram 6-b. According to the rejection level generated by threshold voltage 34, the parasite pulses 30, 33 do not trigger comparator 14. Only the pulses themselves 29, 31, 32 give rise to pulses whose duration corresponds to the time during which the voltage of the pulse itself is greater than the threshold voltage 34.

It should be noted that the form of diagram 6-b should be reversed if the comparator works in positive logic.

Diagram 6-c shows the response of control generator 8 for attenuator 9 when it is formed by a monostable circuit such as in FIGS. 3, 4 and 5. In the absence of any energization at its input 13, the monostable remains inactive. As soon as a signal is applied thereto at input 13, the monostable is placed under a time delay. But AND gate 27 inhibits the time delay by being set to the supply voltage 22. When the input signal rises again the AND gate 27 switches and the secondary time delay of monostable 19 is initiated. This secondary time delay has been shown by the exponential part of each time delay square-wave. The time constant of this time delay is proportional to the value of capacitor 26. This value may be adjustable to adjust the form of the time delay.

The role of the secondary time delay in the behavior of the circuit is to allow removal of instabilities due to too rapid switching. It may correspond, in the case of nondestructive testing of parts, to a filtration equivalent to 0.6 mm of steel.

Diagram 6-d corresponds to the output signal 10 of the base-clipping circuit. The processed pulses themselves have been shifted by a delay T purposely magnified in the drawings. The delay T, identical for all the pulses of the same signal, is adjustable on delay line 5 through circuit 6. It corresponds to the sum of the response times of the different components of line 3 which it allows to be accommodated. The response times are shown in FIG. 6 by the staggering of the initiating edges shown by arrows.

The secondary time delay of monostable 19 is initiated when the input voltage 1 falls below the threshold voltage 34. At that time, the output signal, delayed by a time T by delay line 5, is progressively clipped by controlled switch 9. Thus relaxation disturbances and oscillations are avoided.

Pulses 35, 36 and 37 are said to have their bases clipped. The whole of the input signal has moreover been separated from its noise by rejection level 34. Only the noise induced by the circuit will enter into consideration as well as the residual noise not filtered thereby.

In different applications, the signals to be used are bipolar. For base-clipping in accordance with the invention, there is shown in FIG. 7 a bipolar circuit. It comprises a bipolar input 38 and output 42. The bipolar input signal is separated into two positive or negative signals by a polarity discriminator 39. Discriminator 39 comprises two outputs, the first one driving a monopolar base-clipping circuit called positive channel circuit 40 and the second a similar circuit, called negative channel 41. These two circuits 40 and 41 are similar to the circuit described in FIG. 1. They may comprise at their respective outputs nonreturn systems, for example suitably biased diodes.

The said outputs are then connected to the output 42 of the bipolar circuit. This latter may comprise six independent adjustment inputs:

two threshold-voltage adjustment inputs 43 and 45, input 43 reserved for the negative channel, input 45 reserved for the positive channel;

two delay-adjustment inputs 44 and 46, input 44 reserved for the negative channel, input 46 reserved for the positive channel;

two secondary time-delay adjustment inputs 47 and 48, input 47 reserved for the negative channel, input 48 reserved for the positive channel.

There may exist a unit for linking together these six magnitudes depending on preprogrammed decisions for example. They have not been shown here.

In echoscopy, the frequency band occupied by the pulses themselves extends from 0 to 15 Mhz. The delay line 5 must cover the band occupied. In the case of a required small delay (from 50 to 100 ns), it is possible to replace the delay line by cascading several amplifiers. Switch 9 will be advantageously an FET or MOS transistor. The control generator 19 for the switch will then be formed by a simple logic gate which will only switch from the rejection value.

In the case of an application in the VHF field, the technology will be a hybrid ring-base micro-electric technology for example or else a forced-wave technology with waveguides and tubes TR and ATR. The disturbances due to switching may be corrected by a defined variation of the attenuating control of attenuator 9.

More generally, it is possible to apply the invention to a device for storing the amplitudes of signals and to include it in a level-regulation assembly, for example. The control is then provided at the level of the time delay of delay line 5.

In fact, for storing the peak amplitude of the pulse itself, the fallback into the inactive state of the control of monostable 18 should be caused to coincide with the arrival at the peak of the pulse itself at switch 19. The secondary time delay of monostable 18 allows a phasing adjustment of the stored signal. For that, the T-delay adjustment circuit 6 of delay line 5 and circuit 20 for adjusting the time constant of the secondary time delay of monostable 18 are available.

The circuit of the invention may be adapted to a third application. In fact, the frequency band occupied by the signals themselves is substantially more reduced than the frequency band occupied by possible parasite signals. For example, in the case of a band of signals proper from 0 to 6 Mhz, the parasite signals occupy a band going at least up to 30 Mhz in the case of echoscopy. Components (delay line 5, attenuator 9, comparator 4, etc.) should then be chosen which are linear (within the specifications) in the occupied band, i.e. from 0 to 6 Mhz. The parasite signals neighboring on 30 Mhz are transmitted by the components of the circuit in their nonlinear part. Since their amplitude is lower than that of the signal properly speaking, they will be considerably attenuated by the nonlinear characteristics of the components at 30 Mhz.

For certain forms of pulses proper, it may be necessary to place an RC low-pass filter 50 at the double input of AND gate 27, in line 13 in FIG. 5. Such a circuit then allows the oscillations to be filtered due to the output of the generator 4 of the control signal.

What is claimed is:

1. Linear voltage-pulse base-clipping circuitry with adjustable-threshold condition, comprising for unipolar signals an input (1) for an analog input signal to be processed and an output (10) for a signal after processing, this processing being provided by circuitry comprising two lines (2,3) connected in parallel, the first line, or analog-signal transfer line, comprising in series a delay line (5) and a controllable transfer attenuator (9) and a circuit (6) providing adjustment of a delay of said delay line; the second line, or control line (3), comprises a threshold-condition generator (4) adjustable by means of an adjusting circuit (7), said threshold-condition generator being in series with a control generator (8) whose output is connected to an input of said attenuator; said threshold-condition generator comprising an input-voltage comparator for comparing the input voltage with a reference voltage adjustable by means of said adjusting circuit; and said control generator for the attenuator comprises a monostable with an adjustable time-delay circuit whose output controls the operation of said attenuator.

2. The circuitry as claimed in claim 1, wherein said adjusting circuit for adjusting the threshold condition comprises a potentiometer connected between ground and a DC supply of the circuitry.

3. The circuitry as claimed in claim 1, wherein said adjustable time-delay circuit comprises a capacitor and a resistor supplied with a DC voltage and wherein an initiating circuit is provided for initiating said time delay.

4. The circuitry as claimed in claim 3, wherein said initiating circuit for initiating said time delay of said monostable comprises an AND type gate, connected with open collector, which receives on common inputs a signal from the output of said comparator.

5. The circuitry as claimed in claim 4, wherein said initiating circuit for initiating the time delay of said monostable also comprises upstream of said gate a low-pass RC filtering cell.

6. The circuitry as claimed in claim 1, wherein the delay of said delay line is adjustable by means of an external circuit.

7. Linear voltage-pulse base-clipping circuitry with adjustable-threshold condition, comprising for unipolar signals and input (1) for an analog input signal to be processed and an output (10) for a signal after processing, this processing being provided by circuitry comprising two lines (2,3) connected in parallel, the first line, or analog-signal transfer line, comprising in series a delay line (5) and a controllable transfer attenuator (9) and a circuit (6) providing adjustment of a delay of said delay line; the second line, or control line (3), comprises a threshold-condition generator (4) adjustable by means of an adjusting circuit (7), said threshold-condition generator being in series with a control generator (8) whose output is connected to an input of said attenuator; said threshold-condition generator comprising an input-voltage comparator for comparing the input voltage with a reference voltage adjustable by means of said adjusting circuit; and said control generator for the attenuator comprises a monostable with an adjustable time-delay circuit whose output controls the operation of said attenuator; said circuitry being adapted to receive bipolar signals, wherein the input of the bipolar signals, is connected to a polarity discriminator comprising two outputs, each giving a unipolar signal; each of these two outputs being connected to base clipping circuitry for unipolar signals operating in a given polarity.

8. The circuitry according to claim 1 or 7, wherein said attenuator (9) comprises an analog switch.

* * * * *